United States Patent [19]

Kuster

[11] Patent Number: 5,462,599
[45] Date of Patent: Oct. 31, 1995

[54] METHOD AND APPARATUS FOR COATING BOARD-SHAPED ARTICLES, ESPECIALLY PRINTED CIRCUIT BOARDS

[75] Inventor: Kaspar Kuster, Basel, Switzerland

[73] Assignee: Ciba-Geigy Corporation, Ardsley, N.Y.

[21] Appl. No.: 109,282

[22] Filed: Aug. 19, 1993

[30] Foreign Application Priority Data

Aug. 24, 1992 [CH] Switzerland ............... 2636/92

[51] Int. Cl.$^6$ .................. B05C 5/00; B05C 13/02
[52] U.S. Cl. .................. 118/503; 118/58; 118/314; 118/324
[58] Field of Search ............... 118/58, 72, 314, 118/320, 322, 324, 500, 503; 198/347.1, 347.3, 474.1

[56] References Cited

U.S. PATENT DOCUMENTS

| | | | |
|---|---|---|---|
| 4,230,216 | 10/1980 | Wiens | 198/347.3 |
| 4,408,560 | 10/1983 | Caratsch | 118/503 X |
| 4,559,896 | 12/1985 | Bossard et al. | 118/300 |
| 4,848,533 | 7/1989 | Martin et al. | 198/470.1 |
| 4,867,099 | 9/1989 | Heine et al. | 118/503 X |
| 4,926,789 | 5/1990 | Wenger et al. | 118/668 |
| 4,949,665 | 8/1990 | Weber | 118/324 X |
| 5,113,701 | 5/1992 | Martin | 118/58 |
| 5,113,785 | 5/1992 | Martin | 118/58 |
| 5,188,669 | 2/1993 | Donges et al. | 118/503 |
| 5,221,347 | 6/1993 | Heine | 118/322 X |

FOREIGN PATENT DOCUMENTS

| | | |
|---|---|---|
| 0542684 | 5/1993 | European Pat. Off. |
| 3539959 | 5/1987 | Germany |
| 3738067 | 5/1989 | Germany |
| 4107224 | 6/1992 | Germany |
| 8703076 | 5/1987 | WIPO |
| 9215403 | 9/1992 | WIPO |

OTHER PUBLICATIONS

Abstract for DE 3738067, May 18, 1989.
Abstract for EP 542684, May 19, 1993.

Primary Examiner—Robert J. Warden
Assistant Examiner—E. Leigh Dawson
Attorney, Agent, or Firm—William A. Teoli, Jr.

[57] ABSTRACT

An apparatus for coating board-shaped articles, especially printed circuit boards, comprises a preheating station for the printed circuit boards which is arranged at the entrance to the apparatus, and following the preheating station, in the sequence of their arrangement, at least one coating station for coating at least one side of the printed circuit boards with preferably UV-hardenable plastics, lacquer or the like, and at least one vapour-removal and drying station, each of which processing stations has transport means for the printed circuit boards. The transport means in the vapour-removal and drying station are equipped with carrying elements for the longitudinal edges of the printed circuit boards, the width of which elements can be adjusted to the width of the printed circuit boards to be carried and which support and guide the printed circuit boards at the longitudinal edges over their entire length. In the case of the method according to the invention, the printed circuit boards are aligned only once, directly at the entrance to the first coating station. From that time onwards, the printed circuit boards are supported and guided by the various transport means of the various processing stations always only at the lateral edges. Even when the printed circuit boards, which have been coated on one or both sides, are transferred from one processing station of the coating installation to the next, they are guided and supported substantially constantly at their coating-free longitudinal edges.

16 Claims, 9 Drawing Sheets

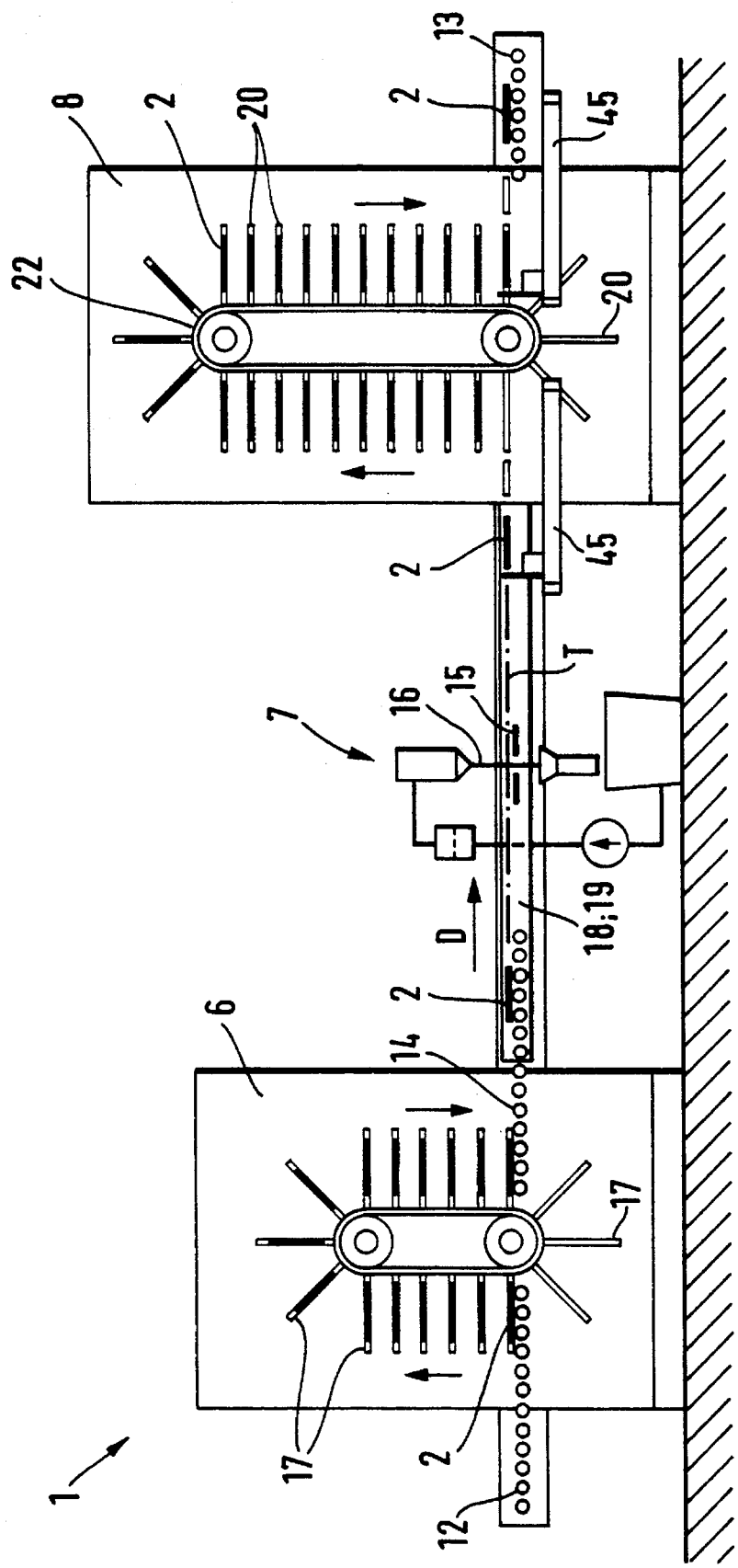

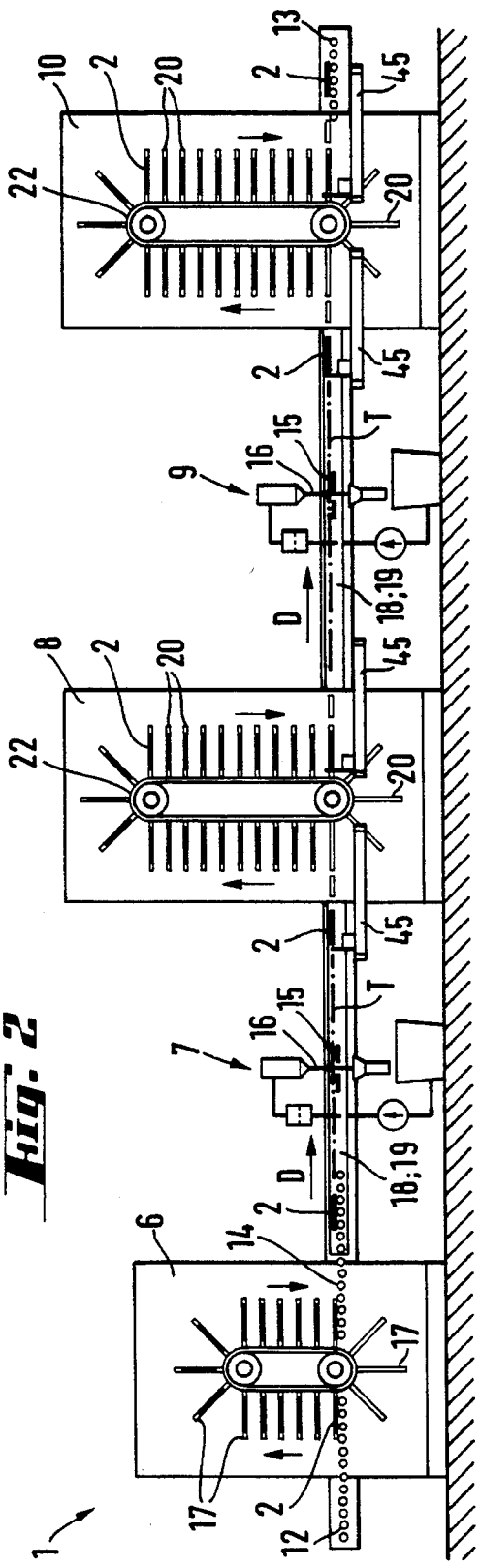
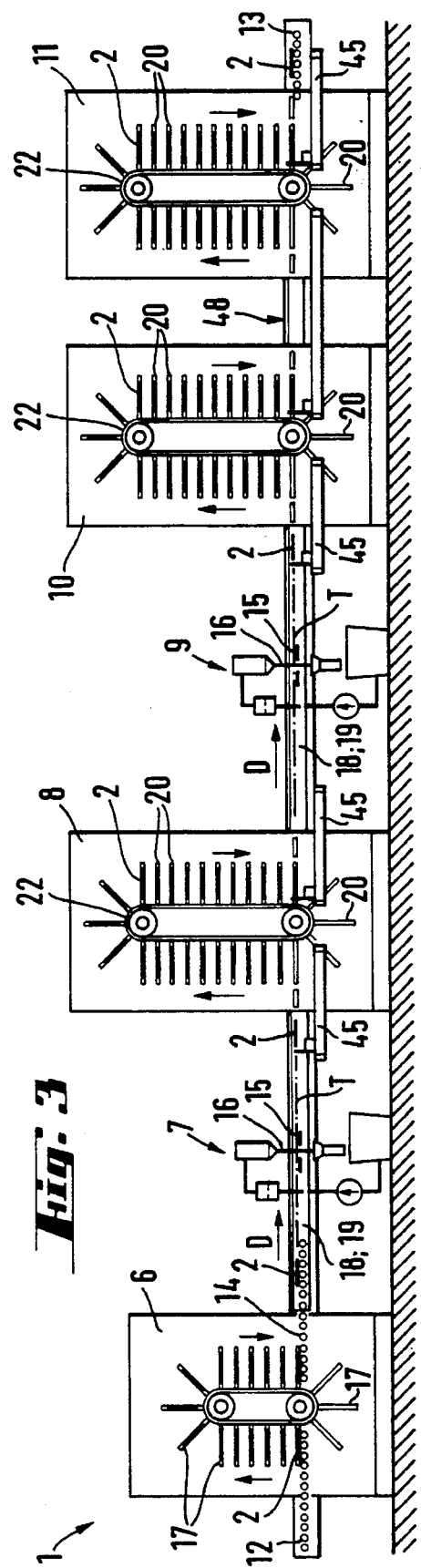

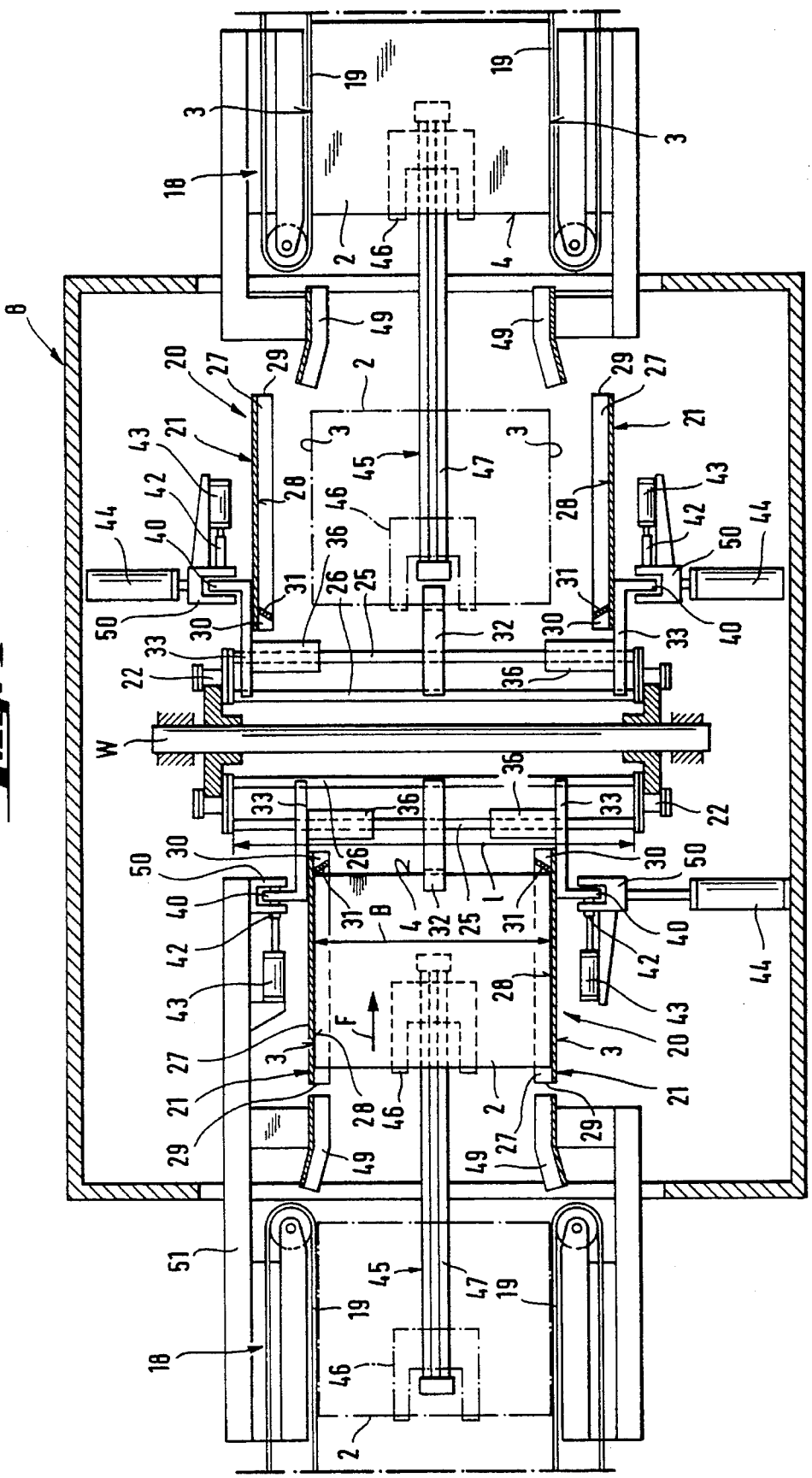

METHOD AND APPARATUS FOR COATING BOARD-SHAPED ARTICLES, ESPECIALLY PRINTED CIRCUIT BOARDS

BACKGROUND OF THE INVENTION

This invention relates to a method and to an apparatus for coating board-shaped articles, especially printed circuit boards.

After they have been provided with conductors, printed circuit boards are coated with a protective layer. The protective layer is a preferably UV-hardenable photographically exposable plastics material, lacquer or the like. After drying of the protective layer, it is exposed in a suitable form and developed at the exposed sites. The conductors are then free at those sites and can be electrically contacted. In the case of printed circuit boards that are provided with conductors on both sides, both surfaces of the boards have to be coated without, when coating the second side, damaging the coating already applied to the first side. In order to be coated, the printed circuit boards have to be transported through a series of processing stations of a coating installation. There the previously cleaned printed circuit boards are first pre-heated and provided with a protective layer on one side. For that purpose, the printed circuit boards to be coated are transported through a coating station, preferably under a free-falling pouring curtain. When the first side has been coated, the printed circuit boards are transported to a vapour-removal and drying station in which the solvent is evaporated (removed by a current of air) and the coated surface of the printed circuit boards is dried. If the second side of the printed circuit boards is also to be coated, the boards are turned, transported under a pouring curtain of a coating station again and finally subjected to vapour removal and dried in a vapour-removal and drying station.

When the printed circuit boards are being transported from one processing station to the next, especially when the boards are being transported while the coating is still wet and in the case of printed circuit boards already coated on one side, care must be taken that the printed circuit board and the coating are not damaged or impaired. The transport of the printed circuit boards in the individual processing stations and from station to station is effected by means of various automatic conveyors. The trend to use ever thinner printed circuit board materials, however, gives rise to the problem that the printed circuit boards tend to sag while being transported, especially owing to the thermal treatment in the preheating station and in the vapour-removal and drying stations, and to touch the conveyors or transport means with their undersides. This is a particular problem when the printed circuit boards are to be coated on both sides and, in so doing, the still soft protective coating on the undersides of the printed circuit boards is damaged. In addition, the conveyors or transport means can also become soiled.

The prior art has accordingly proposed various transport apparatuses and holding devices for printed circuit boards in the various processing stations. U.S. Pat. No. 5,113,701 proposes that the printed circuit boards be inserted after coating into holding frames having prongs arranged in a V-shape. Those holding frames are fixed to a drying station and have a predetermined frame width. Outside the drying station, the printed circuit boards are transported on roller conveyors arranged in a V-shape. Although in the case of that proposed solution the printed circuit boards are touched and supported substantially only at their longitudinal edges, it may happen, especially in the case of very thin printed circuit boards of great length and width, that they nevertheless rest on the prongs of the holding frames or on the rollers of the roller conveyors. As a result, and owing to the fact that the holding frames and/or the roller conveyors have a fixed width, other printed circuit boards transported in the soiled frames may become contaminated. Furthermore, the proposed coating installation requires a separate centring station which aligns the printed circuit boards before they are transported under the pouring curtain in the coating station.

U.S. Pat. No. 4,926,789 describes holding devices for printed circuit boards that have clips which grip the printed circuit boards at several sites along their longitudinal edges. In the proposed coating installation the printed circuit boards are transferred together with the holding devices from one processing station to the next. Not until the exit of the coating installation is reached are the holding devices removed from the boards again and transported back to the entrance to the installation. The described installation is relatively complicated in terms of construction and requires separate feed lifts, conveyor belts and transport means for the holding devices. In addition, actuating devices for the holding clips of the holding devices have to be provided at the entrance and the exit of the coating installation. There is also a risk in the coating station that the holding devices will become soiled during transport under the pouring curtain.

U.S. Pat. No. 4,848,533 describes a printed circuit board transport apparatus that has two chains or the like circulating parallel to one another. The chains are connected by cross-pieces arranged at a distance from one another. Two holding devices constructed as clamps are mounted on each cross-piece so as to be displaceable relative to one another in a braked manner. In a board-receiving station, two pneumatically driven rams push the passing holding devices in pairs onto the longitudinal edges of the boards where they become clamped. Thus, at least two, but generally more than two, pairs of holding devices are clamped along the longitudinal edges of a printed circuit board, and the latter is transported along the transport path, held in that manner. In a board unloading station are provided two other rams which push the holding devices apart again, as a result of which the printed circuit boards are released again. In the case of the described transport apparatus, the printed circuit boards are held at their longitudinal edges by at least two pairs of holding devices, thus ensuring that the undersides of the boards do not come into contact with the transport chains or with the cross-pieces. The transport apparatus is, however, designed only for the horizontal transport of the printed circuit boards, for example under the pouring curtain. In order to transfer the boards, for example, to the drying station, the holding devices must first be removed again, and the boards must be loaded, for example, onto a roller conveyor by means of which they can then be moved into the holding devices of the drying station. The apparatus is relatively complicated in terms of construction. The many pairs of holding devices, which must be displaceable relative to one another on the cross-pieces, constitute a possible source of faults. For example, one or more cross-pieces could be soiled, which can greatly impair the displaceability of the holding devices with the result that reliable grasping of the printed circuit boards is no longer ensured.

OBJECTS AND SUMMARY OF THE INVENTION

The problem is accordingly to provide a method and an apparatus for coating board-shaped articles, especially printed circuit boards, which method and apparatus take into account and eliminate the previously described disadvantages of the methods and apparatuses of the prior art. In particular, the method is to permit a printed circuit board to be transported without damage through a vapour-removal and drying station with vertically circulating carrying elements and to be turned during transport. The printed circuit board is to be guided and supported substantially constantly along its coating-free longitudinal edges. The interface between the coating station and the vapour-removal and drying station is to be free of roller conveyors or similar transport apparatuses. The printed circuit boards are not to be clamped or gripped at their longitudinal sides but are nevertheless to be guided. In addition, it is also to be ensured that the undersides of the horizontally transported printed circuit boards do not come into contact with the transport means even in the heated state. Also to be provided are the prerequisites for a coating installation in which the printed circuit boards are held and/or guided inside the individual processing stations by various transport means and are transferred at the interfaces to the transport means of the following processing station, being supported or guided substantially constantly at their longitudinal edges. Centring of the printed circuit boards is to be necessary only before the first coating operation, and from then on the printed circuit boards are to be transported in the centred position.

All those and other associated problems are solved by a method of coating board-shaped articles, especially printed circuit boards, in which the printed circuit boards are transported through several consecutive processing stations of a coating installation (1), in which stations they are preheated, wet-coated at least on one side with preferably UV-hardenable plastics, lacquer or the like, and in each case after one side has been coated they are subjected to vapour-removal and dried, wherein, after being coated, the printed circuit boards are transferred to carrying elements of a vapour-removal and drying station, which elements are fixed to the station, the carrying elements being adjustable to a width which corresponds to the width of the printed circuit boards to be transported, and wherein the printed circuit boards are supported and guided over their entire length at the longitudinal edges. An apparatus to carry out the method according to the invention comprises a preheating station for the printed circuit boards which is arranged at the entrance to the apparatus, and following the preheating station, in the sequence of their arrangement, at least one coating station for coating at least one side of the printed circuit boards with preferably UV-hardenable plastics, lacquer or the like, and at least one vapour-removal and drying station, each of which processing stations has transport means for the printed circuit boards. The transport means in the vapour-removal and drying station are equipped with carrying elements for the longitudinal edges of the printed circuit boards, the width of which elements is adjustable to the width of the printed circuit boards to be carried and which support and guide the printed circuit boards at the longitudinal edges over their entire length. The printed circuit boards are aligned only once, directly at the entrance to the first coating station. From that time onwards, the printed circuit boards are supported and guided by the various transport means of the various processing stations always only at the lateral edges. Even when the printed circuit boards, which have been coated on one or both sides, are transferred from one processing station of the coating installation to the next, they are guided and supported substantially constantly at their coating-free longitudinal edges.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings in the several figures of which like reference numerals identify like elements, and in which:

FIGS. 1 to 3 show three embodiments of the coating installation according to the invention with differing degrees of development, FIG. 4 is a plan view of a vapour-removal and drying station of the coating installations according to FIGS. 1 to 3, FIGS. 5 and 6 show details of the securing of carrying elements in the vapour-removal and drying station according to FIG. 4.

DETAILED DESCRIPTION OF THE INVENTION

Figure 5:
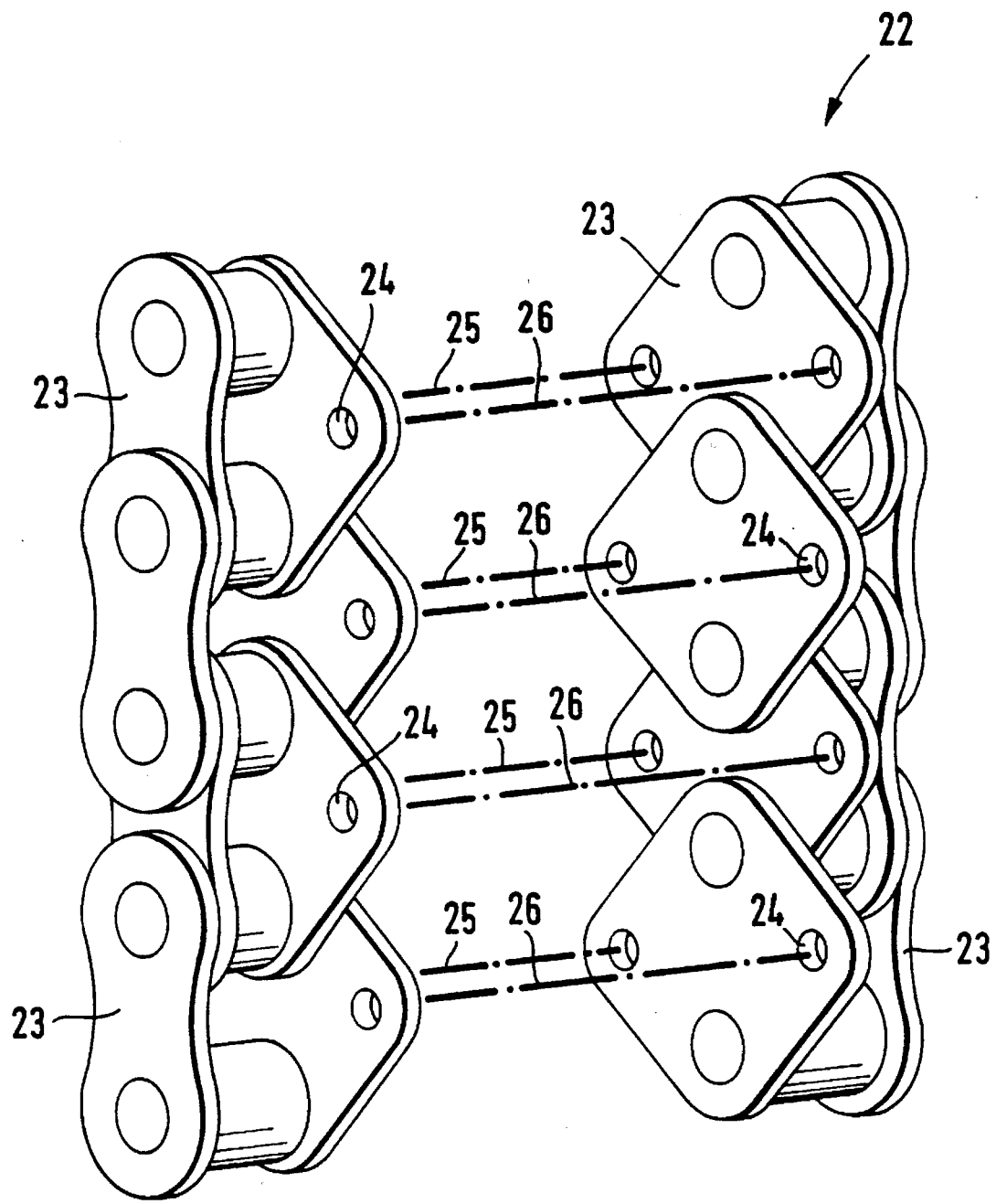
Figure 6:
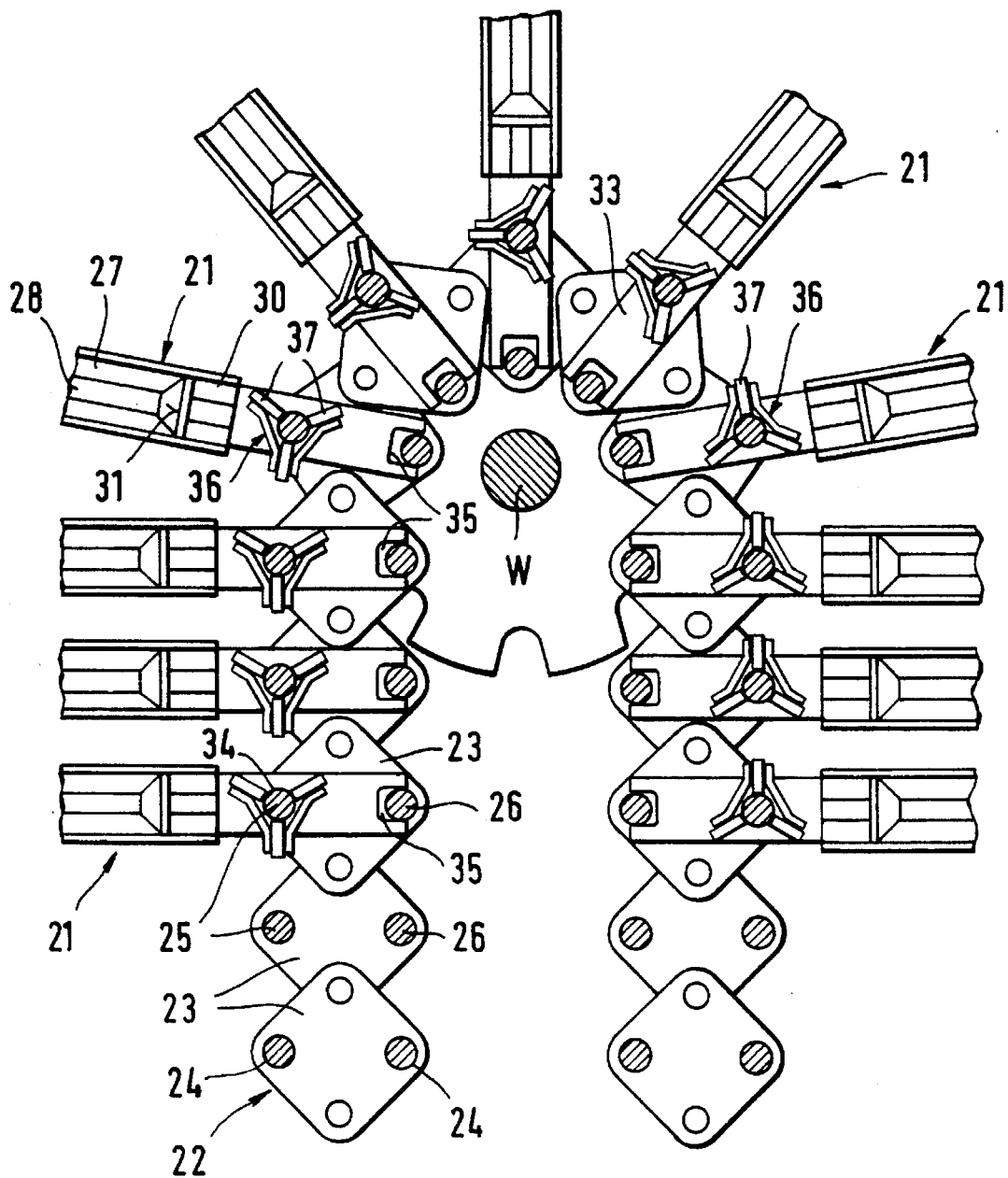

A printed circuit board coating installation shown in three embodiments in FIGS. 1 to 3 has, in each case, the general reference numeral 1. The three embodiments of the coating installation according to the invention differ from one another in their differing degrees of development, that is to say, in the differing number of processing stations for printed circuit boards 2 to be coated.

The coating installation 1 shown schematically in FIG. 1 comprises, in the sequence of their arrangement, a preheating station 6, a coating station 7 and a vapour-removal and drying station 8, through which the printed circuit boards 2 pass in succession in the direction of passage D. A feed-in roller conveyor 12 and a transfer roller conveyor 14 are provided at the entrance and the exit, respectively, of the preheating station. Arranged at the exit of the vapour-removal and drying station 8 is a delivery roller conveyor 13 by means of which the printed circuit boards 2 can be conveyed to other processing installations. In the individual stations, the printed circuit boards are received by transport means 17, 18 and 20 and transported through the particular station and transferred to the processing station that follows in the direction of transport D of the printed circuit boards 2.

The coating station 7 comprises a pouring table 15 having a pouring head. The pouring head is so constructed that preferably UV-hardenable plastics C, lacquer or the like, which is pumped to the pouring head, forms a free-falling pouting curtain 16 under which the surfaces of the printed circuit boards 2 to be coated are transported. The lateral extent of the pouring curtain 16, transverse to the direction of transport D of the printed circuit boards 2, is delimited by pouring blades. A pouting head of that type is described, for example, in U.S. Pat. No. 4,559,896, the content of which is hereby declared to be an integral part of the present description. The pouring blades ensure that a narrow margin along the longitudinal sides of the printed circuit boards 2 remains free of the coating C. The transport means 18 for the printed circuit boards 2 in the coating station 7 comprise lateral guide means 19 for the longitudinal edges of the printed circuit boards. The guide means 19 are formed preferably by two laterally arranged conveyor belts each of which runs round an associated guide bar in the direction of transport D of the printed circuit boards 2. The guide bars can be adjusted automatically, preferably electro-pneumatically, to the width of the printed circuit boards. The printed circuit boards 2 are thus aligned so that their longitudinal edges run approximately parallel to the direction of transport D. The conveyor belts grip the longitudinal edges of the printed circuit boards 2 and transport them for the purpose of coating under the free-falling pouting curtain 16. In the course of that operation, the pouring blades laterally delimiting the pouring curtain ensure that the conveyor belts do not become soiled. Such a coating station with all its details is described, for example, in EP-A-0 542 684, the content of which is hereby declared to be an integral part of the present description. The coating installation 1 according to FIG. 1 is designed to coat only one surface of the printed circuit boards 2 and comprises only the basic equipment absolutely necessary.

The embodiments shown in FIGS. 2 and 3 of the coating installation 1 according to the invention are suitable for coating the printed circuit boards 2 on both sides. According to the schematic representations, compared with the first embodiment according to FIG. 1 they have been supplemented by a second coating station 9 and an additional vapour-removal and drying station 10 (FIG. 2) and by two such vapour-removal and drying stations 10 and 11 (FIG. 3). In the first vapour-removal and drying station 8, the printed circuit boards 2 coated on one side are dried to the extent that they can be turned without the risk of damaging the coating C. At the exit of the first vapour-removal and drying station 8, the printed circuit boards 2 are transferred to the second coating station 9. The structure of the second coating station 9 corresponds to that of the first coating station. When the second surface has been coated, the printed circuit boards are transferred to the second vapour-removal and drying station 10, which corresponds to the first vapour-removal and drying station 8. Depending on the speed of passage of the printed circuit boards 2 through the second vapour-removal and drying station 10, the boards have been completely dried by the time they reach the exit of the station and are conveyed out of the coating installation 1 by means of the delivery roller conveyor 13 (FIG. 2). In the case of coating installations 1 having a relatively high throughput of printed circuit boards 2, there is provided, following the second vapour-removal and drying station 10, a third vapour-removal and drying station 11, the structure of which likewise corresponds to that of the first 8 (FIG. 3). Provided between the second and third vapour-removal and drying stations 10 and 11 are transport means 48 by means of which the printed circuit boards are transported from one station to the next. Those transport means 48, analogous to the transport means 18 in the coating stations 7 and 9, preferably comprise lateral guide means 19 for the longitudinal edges of the printed circuit boards. Those guide means 19 are formed by two laterally arranged conveyor belts each of which runs round an associated guide bar in the direction of transport D of the printed circuit boards 2. The guide bars can be adjusted automatically, preferably electro-pneumatically, to the width of the printed circuit boards. The printed circuit boards 2 are thus aligned so that their longitudinal edges run approximately parallel to the direction of transport D. The conveyor belts grip the longitudinal edges of the printed circuit boards 2 emerging from the second vapour-removal and drying station 10 and transport them further to the third vapour-removal and drying station 11. The preheating station 6 and the vapour-removal and drying stations 8, 10 and 11 are formed preferably by vertical circulating ovens in which the printed circuit boards are at the same time turned during the thermal treatment.

FIGS. 4 to 12 show an embodiment of a vapour-removal and drying station 8 and 10 or 11 according to the invention in various views in section and detailed representations. As indicated schematically in FIGS. 1 to 3 and shown in greater detail in FIGS. 4, 6 and 8, the station is equipped with a series of carrying elements 20 for the printed circuit boards 2. In particular, those carrying elements 20 can be adjusted to the width B of the inserted printed circuit boards 2. Each of the carrying elements 20 comprises two carrying arms 21 which extend approximately parallel to the longitudinal edges 3 of an inserted printed circuit board 2. At least one of the carrying arms 21, and both of the carrying arms according to the embodiment shown in FIG. 4, can be displaced transversely to their longitudinal extent. Each carrying element 20 is secured to two preferably vertical endless circulating roller chains 22 which are arranged opposite one another (FIGS. 5 and 6) and which are driven by a drive shaft W. The roller chains have links 23 which are provided with two drilled holes 24. Two guide rods 25 and 26 are inserted in the two drilled holes 24 of each link 23 and connect the two endless circulating roller chains. The carrying arms 21 of the carrying elements 20 are displaceable in pairs relative to one another on the guide rods connecting the two chains 22 (FIG. 4).

According to FIG. 4, each carrying arm 21 comprises a guide rail 27 having a longitudinal groove 28 which has an approximately V-shaped profile and an included angle α of from approximately 30° to 50°, preferably approximately 40°. The guide rail 27 is constructed to be open at its end 29 remote from the chain 22 so that the longitudinal edge 3 of a printed circuit board 2 can be inserted. At the end 30 facing the chain 22, a stop 31 for the transverse edge 4 of an inserted printed circuit board is provided in the longitudinal groove 28. The guide rails 27 of each pair of carrying arms 21 are so arranged that their longitudinal grooves 28 face one another and run approximately parallel to the longitudinal edges 3 of the printed circuit boards 2 to be inserted.

Figure 9:
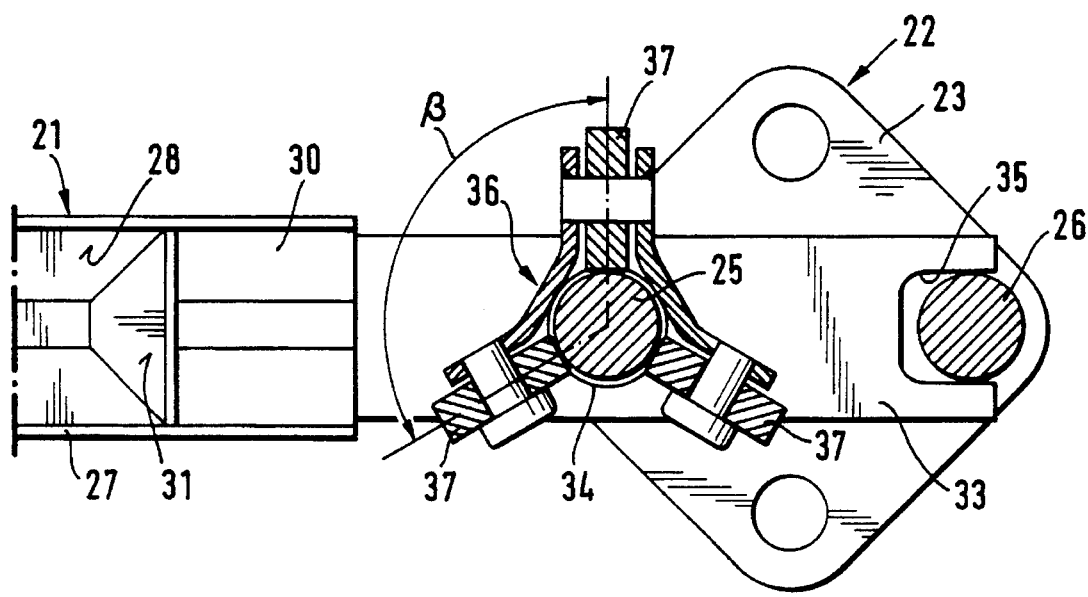
Figure 10:
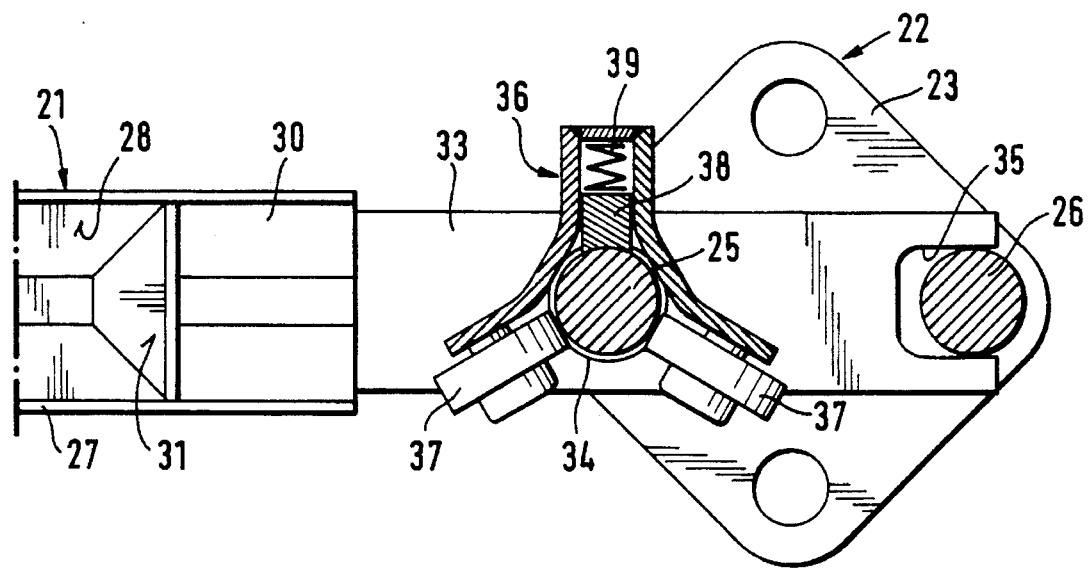

The guide rails 27 are mounted on holding devices 33 (FIG. 7) which are equipped with a drilled hole 34 for receiving the guide rod 25 that is at the front viewed from the direction of insertion F of the printed circuit boards 2 into the carrying elements 20. It should be borne in mind that the direction of insertion F of the printed circuit boards 2 into the carrying elements 20 of the vapour-removal and drying apparatus is identical with the substantially horizontal direction of transport D of the printed circuit boards 2. At their rear ends, the holding devices 33 have fork-like guide members 35 which engage round the rear guide rod 26 (FIGS. 9 and 10). The advantage of that structural feature is that tensile stresses do not occur in the rear guide rods 26 or in the holding devices 33 at the turn-round sites of the endless circulating roller chains 22.

Figure 7:
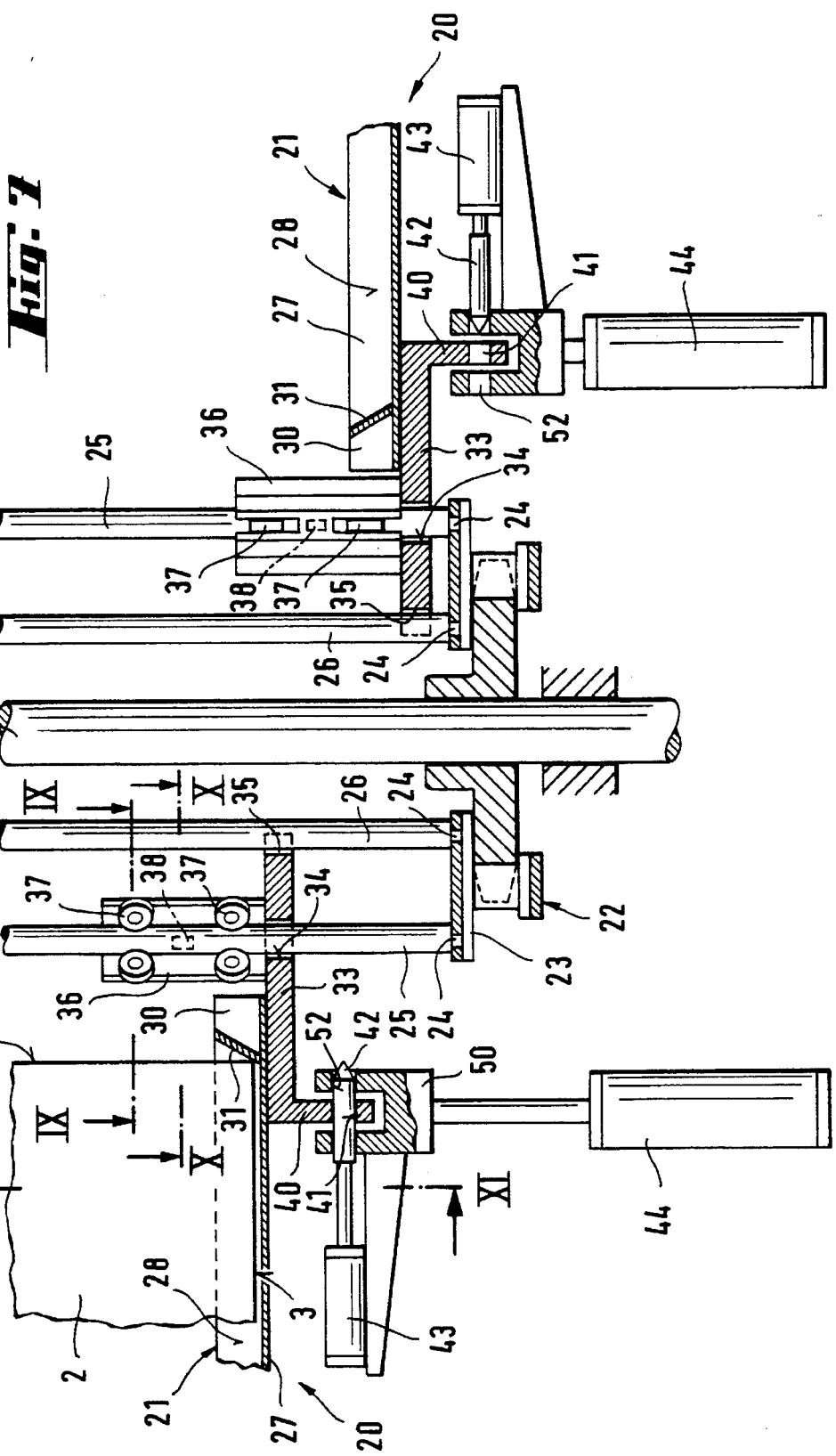
FIG. 7 is a partly sectional plan view of details of the vapour-removal and drying station according to FIG. 4.

According to the representations in FIG. 7 and in FIGS. 9 and 10, each holding device 33 is equipped with a running carriage 36 in the region of the drilled hole 35. Each running carriage 36 is equipped with rollers 37 which are so arranged one behind the other along the circumference of the front guide rod 25 that the holding device 33, and with it the guide rail 27, can be displaced along the front guide rod 25 without tilting. Preferably, the running carriage 36 comprises six rollers 37 which are in two triplets spaced apart along the length of the running carriage. The rollers 37 of each roller triplet are separated with respect to one another at an angle β of approximately 120° so that the rollers touch the guide rod 25 in regions that are separated with respect to one another at approximately the same angle. According to the representation in FIG. 10, each running cardage 36 has a brake formed by a brake block 38 which is pressed against the front guide rod 25 by a spring 39.

Figure 11:
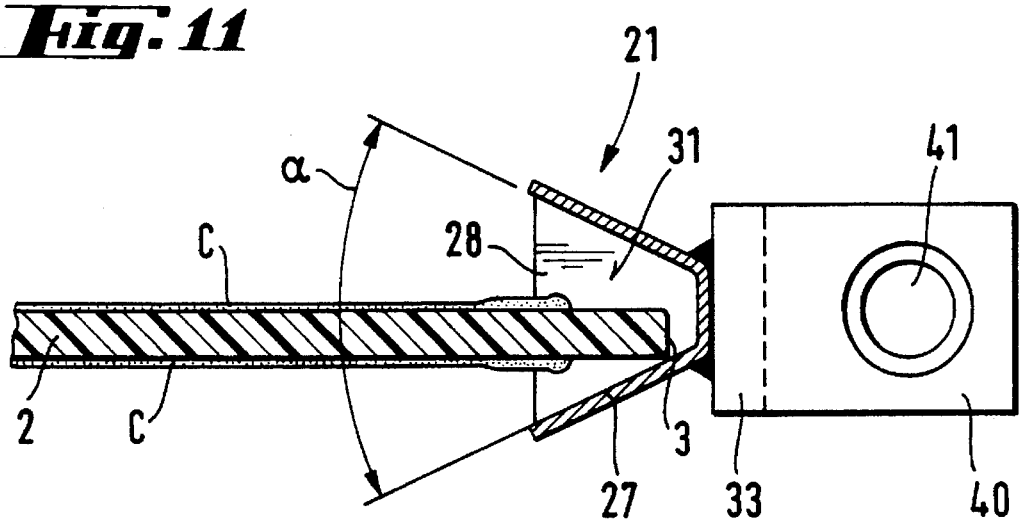
Figure 12:
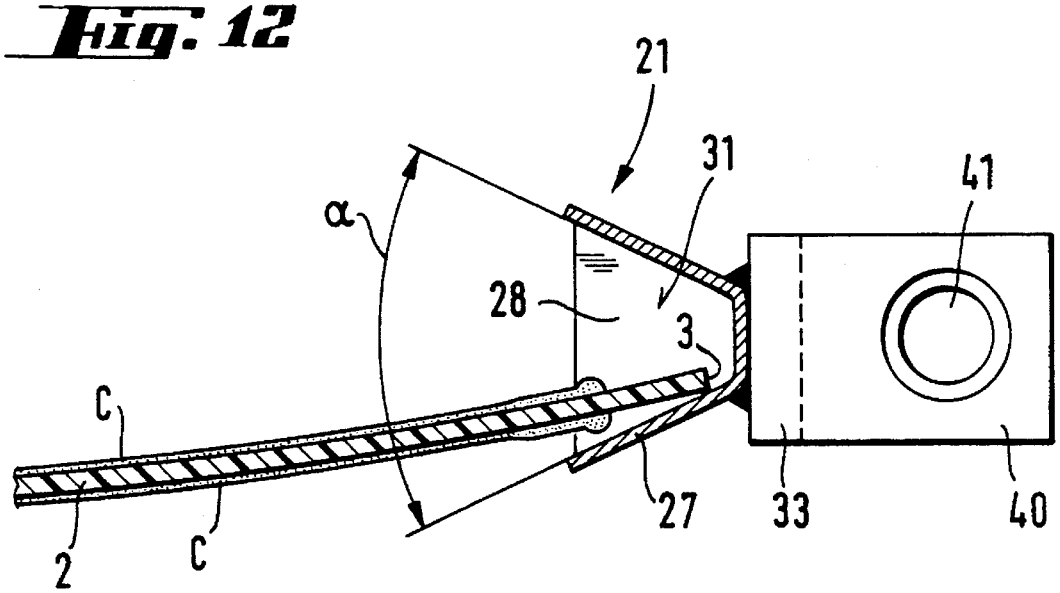

The width of the carrying elements 20 is adjusted by a preferably pneumatic displacement of at least one of the two carrying arms 21 of each carrying element 20. FIG. 4 shows two embodiments of those adjusting elements. Mechanical adjusting means are shown for the adjustment of the carrying arm 21 that is on the left viewed from the direction of insertion of the printed circuit boards 2. Pneumatic adjusting means are indicated for the carrying arm 21 on the right. It will be understood that only either the one—mechanical—or the other—pneumatic—adjusting means is provided for the adjustment of the two carrying arms 21. Common to the two adjusting means is that there is arranged on each holding device 33 a stop 40, extension or the like which, as shown in FIGS. 4 and 7, extends outwards approximately parallel to the longitudinal extent of the guide rods 25, 26. In the case of the adjusting means for the right carrying arm 21, the stop 40 can be connected to a ram 50 of pneumatic transverse adjusting means 44 for the carrying arms 21. In the case of the mechanical adjusting means, an adjusting arm 51 extends from each of the guide bars of the guide means 18 for the printed circuit boards in the coating station 7 parallel to the direction of transport D of the boards and in the direction towards the entrance to the vapour-removal and drying station 8. The adjusting arms 51 can be adjusted together with the guide bars to the width B of the transported printed circuit boards 2. At the entrance to the vapour-removal and drying station 8, a ram 50 is provided at the end of the adjusting arm 51, which ram can be coupled to the stop 40. In order to be able not only to displace the carrying areas 21 towards one another but also to move them away from each other again, the stop 40 is equipped with a drilled hole 41 (FIGS. 7 and 11 or 12). Accordingly, the ram 50 of the pneumatic transverse adjusting means 44 or the ram at the end of the adjusting arm 51 also has a drilled hole 52. A locking pin 42 which can be operated by a preferably pneumatic &five 43 can be pushed through the drilled holes 41 and 52. In the case of the pneumatic adjusting means, the drive 43 is connected to the transverse adjusting means 44. In the case of the mechanical adjusting means, the drive is secured to the adjusting arm 51 and can be displaced therewith. The ram 50 and the stop 40 can thus be locked together and the carrying arm 21 can be pulled outwards again in order to increase the width of the carrying element again. In that manner, the transverse adjusting means are mechanically coupled to the adjusting means for the width adjustment of the lateral guide means 19 in the coating station, or they can be coupled in terms of control so that the width adjustment of the carrying elements 20 is effected in dependence on the width adjustment of the lateral guide means.

A support member 32 for the leading transverse edge 4 of an inserted printed circuit board preferably extends away from the guide rods 25, 26. That support member 32 extends below the plane of insertion defined by the plane of transport T of the printed circuit boards in the coating station, approximately as far as a region which corresponds approximately to the imaginary connecting line of the rear end-face stops 31 in the longitudinal grooves of the guide rails 27 of a pair of carrying arms 21. The support member is secured at the circumference of the guide rods 25, 26 in a region that extends from approximately the first quarter over approximately the third quarter of the length 1 of the guide rods 25, 26 and is located preferably approximately in the region of halfway along the length 1 of the guide rods 25, 26. Thus arranged, the support member 32 extends as far as the leading transverse edge 4 of the inserted printed circuit board and supports the underside thereof in such a manner that even thin boards do not sag.

Figure 8:
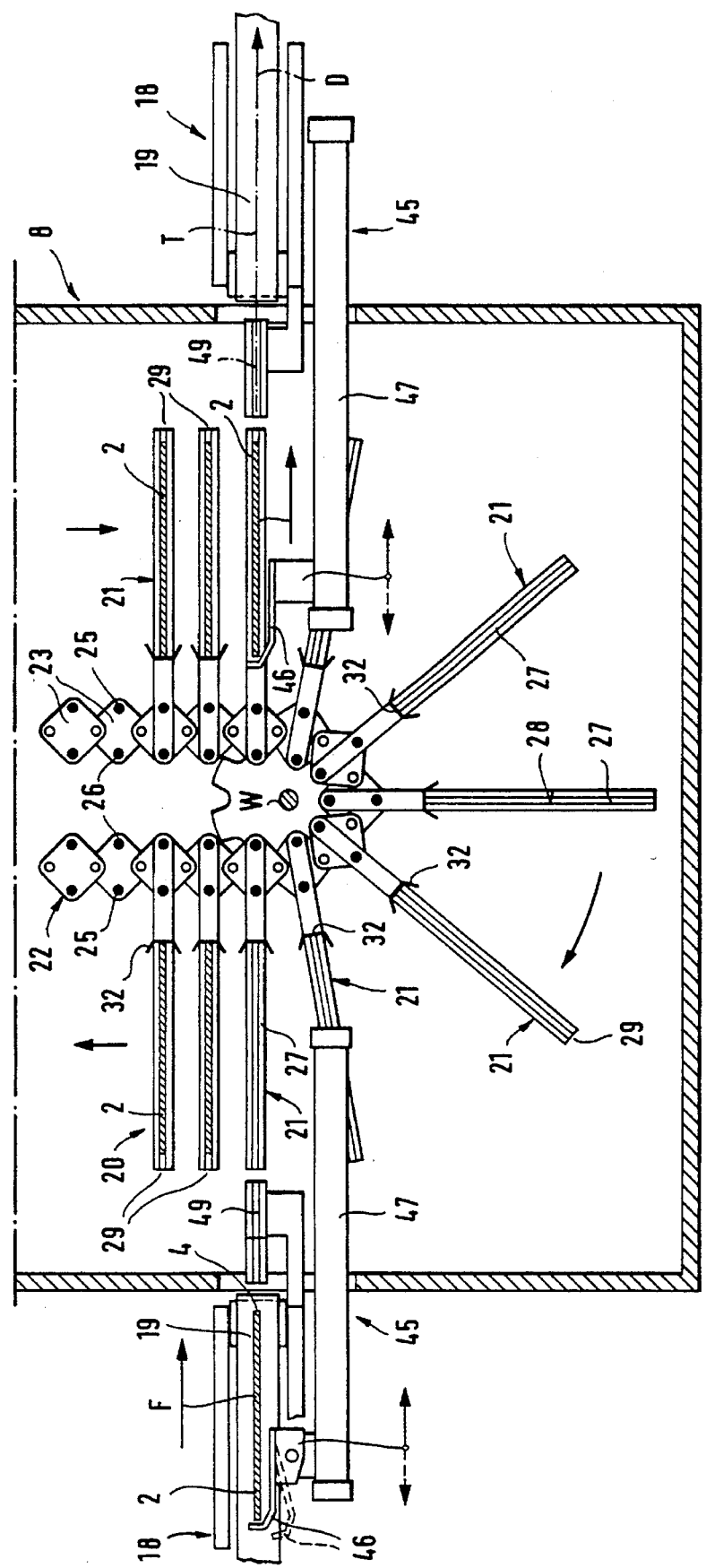
FIG. 8 shows a longitudinal section through the vapour-removal and drying station according to FIG. 4 and FIGS. 9 to 12 show four sections through the carrying elements according to the section lines IX, X and XI in FIG. 7.

As indicated in FIGS. 1 to 3 and shown in detail in FIGS. 4 and 8, advancing means 45 for the printed circuit boards 2 are provided at the entrance and the exit of the vapour-removal and drying station and are fixed thereto, by means of which advancing means 45 the printed circuit boards 2 are taken from the transport means of the preceding processing station and can be inserted into the carrying elements 20 or can be pushed out of the carrying elements 20 again after the printed circuit boards 2 have been turned. Those advancing means 45 are arranged below the horizontal transport plane T of the printed circuit boards 2. They comprise a displacing element 46 which acts on the transverse edge 4 of the printed circuit boards 2 that is at the rear in relation to the direction of transport D. A preferably pneumatic drive 47 permits the displacing element 46 to be moved in or counter to the direction of transport D of the printed circuit boards 2. As also shown in FIGS. 4 and 8, guide channels 49 for the printed circuit boards 2 may also be provided at the entrance and the exit of the vapour-removal and drying station. Those channels are preferably connected to the lateral guide elements 18 of the coating stations. They are preferably short V-shaped guide rails which are curved slightly outwards at the entrance in order to present an approaching board with an approximately funnel-shaped run-in path.

For the purpose of coating, the printed circuit boards 2 are heated in the preheating station 6. In the preheating station 6 it is not necessary to have special carrying elements 17 that grip the printed circuit boards only at the longitudinal edges, because the boards have of course not yet been coated. The boards can accordingly be transported, for example, in carrying elements having horizontal prongs projecting from two bars. When the boards are turned, they are simply flipped onto the rear side of the preceding carrying element 17, are transported downwards in that position and are deposited on the transfer roller conveyor 14. From the transfer roller conveyor 14, the printed circuit boards pass to the first coating station 7 in which they are gripped at their longitudinal edges 3 by the lateral guide means 18, and aligned and transported under the pouting curtain 16. They are guided always at their longitudinal edges 3. At the exit of the first coating station 7, the printed circuit boards 2 pass into the draw-in region of the advancing means 45 which push the printed circuit boards 2, which have now been coated on one side, into the carrying elements 20 of the first vapour-removal and drying station 8, the width of which elements has already been adjusted in dependence on the width adjustment of the lateral guide means 18 in the first coating station 7. During upward transport in the vertical circulating oven, the coated surface of the printed circuit boards 2 is dried to the extent that the coating C does not run or drain off when the boards are turned, at which time they of course stand upright for a brief period. After the downward transport of the printed circuit boards, they are withdrawn from the carrying elements again at the exit of the station by further advancing means 45. If the boards are to be coated only on one side, they pass to the delivery roller conveyor 13 from which they can be further transported to other processing stations.

If the boards are to be coated on both sides, they are transferred by the advancing means 45 at the exit of the first vapour-removal and drying station 8 to the lateral guide means 18 of the second coating station 9. Held and guided laterally, the printed circuit boards 2 are again transported under the pouring curtain 16 and the second surface is coated. It should be borne in mind that the printed circuit board 2 is always held and guided only at its longitudinal edges 3. The already coated surface never comes into contact with the transport means. At the exit of the second coating station 9, the printed circuit boards 2 pass into the draw-in region of the advancing means 45 of the second vapour-removal and drying station 10 which pushes the printed circuit boards 2 which have now been coated on one side into the carrying elements 20 of the second vapour-removal and drying station 10, the width of which elements has already been adjusted in dependence on the width adjustment of the lateral guide means 18 in the second coating station 9. During upward transport in the vertical circulating oven, the second coated surface of the printed circuit boards 2 is dried to the extent that the coating C does not run or drain off when the boards are turned, at which time they of course stand upright for a brief period. The already pre-dried first coated surface is further dried so that the boards can be deposited on that surface at the exit of the station without damaging the coating C. After the downward transport of the printed circuit boards, they are withdrawn from the carrying elements again at the exit of the station by further advancing means 45 and transferred to the delivery roller conveyor 13. If the speed of passage of the printed circuit boards 2 through the continuous flow drier is so high that the surface that is underneath when the exit is reached has not yet been dried sufficiently, the printed circuit boards 2 may, at the exit of the second vapour-removal and drying station 10, be transferred to another, third drying station 11, for which purpose transport means 48 are provided which push the printed circuit boards out of the transport elements 20 of the one station and into the transport elements 20 of the following station. Those transport means 48 preferably comprise advancing means 45 which have the same construction as the transport means at the entrance to the preceding station. Lateral guide members may also be provided, the distance of which from one another can be adjusted in dependence on the width B of the printed circuit boards 2. After passing through the third vapour-removal and drying station 11, the surfaces of the printed circuit boards 2 have been dried to the extent that the coatings C can no longer be damaged as a result of the boards' being transported lying down.

In the case of the method according to the invention, the printed circuit boards 2 are aligned only once, directly at the entrance to the first coating station. From that time onwards, the printed circuit boards 2 are supported and guided by the various transport means of the various processing stations always only at the lateral edges. Even when the printed circuit boards 2, which have been coated on one or both sides, are transferred from one processing station of the coating installation to the next, the printed circuit boards 2 are guided and supported substantially constantly at their coating-free longitudinal edges 3. The boards are not clamped or held. A support member supports the leading transverse edge 4 of the printed circuit boards 2 during thermal treatment so that even thin printed circuit boards 2 are assured damage-free transport through the vapour-removal and drying station(s). Only the uncoated surface of a printed circuit board 2 or the sufficiently dried coating C of the printed circuit boards comes into contact with roller conveyors, conveyor belts or the like. The coating installation has a compact structure, and roller conveyors, which take up a large amount of space, can be dispensed with at the interfaces between the coating stations and the vapour-removal and drying stations and between series-arranged drying stations.

The invention is claimed as follows:

1. An apparatus which comprises: a transport and coating apparatus for printed circuit boards, which includes
   a preheating station for the printed circuit boards which is arranged at an entrance to the apparatus, and following the preheating station, in the sequence of their arrangement, at least one coating station for coating at least one side of the printed circuit boards with a protective layer, and at least one vapour-removal and drying station, each of which processing stations has an associated individual transport means for the printed circuit boards,
   wherein the transport means in the vapour-removal and drying station comprise carrying elements for longitudinal edges of the printed circuit boards, which carrying elements are fixed to the vapour-removal and drying station and are adjustable to a width which corresponds to a width of the printed circuit boards may be carried and which support and guide the printed circuit boards at the longitudinal edges over their entire length,
   wherein each carrying element comprises two carrying arms which extend approximately parallel to the longitudinal edges of the boards, at least one of the carrying arms being displaceable transversely to the longitudinal extent of the carrying arms,
   wherein each carrying element is secured to two endless circulating roller chains which are arranged opposite one another, each link of the chains being provided with drilled holes for receiving guide rods of approximately circular cross-section along which the carrying arms are displaceable transversely to their longitudinal extent.

2. An apparatus according to claim 1, wherein the carrying arm of each pair of carrying arms comprises a guide rail having a longitudinal groove of approximately V-shaped profile which is constructed to be open at its free end remote from the chain and at its other end has a stop for the transverse edge of the inserted printed circuit board, and wherein the guide rails of each pair of carrying arms are so arranged that their longitudinal grooves extend parallel to one another and face one another.

3. An apparatus according to claim 2, wherein the included angle of the longitudinal groove is approximately from 30° to 50°, preferably approximately 40°.

4. An apparatus according to claim 2, wherein a support member for a front transverse edge of the inserted printed circuit board extends away from the guide rods and is secured at the circumference of the guide rods in a region that extends from approximately the first quarter over approximately the third quarter of the length of the guide rods and is located preferably approximately in the region of halfway along the length of the guide rods, which support member extends below the plane of insertion of the printed circuit boards approximately as far as the rear end-face stop in the longitudinal groove of the guide rail.

5. An apparatus according to claim 4, wherein each guide rail is secured to a holding device which is equipped with a drilled hole for receiving the guide rod that is at the front viewed in the direction of transport of the printed circuit board and which holding device has at its rear end a fork-like guide member which engages round the second, rear guide rod.

6. An apparatus according to claim 5, wherein the holding device is equipped in the region of the drilled hole with a running carriage-having a number of rollers which are so arranged one behind the other along the circumference of the front guide rod that the holding device is displaceable long the front guide rod without tilting.

7. An apparatus according to claim 6, wherein the running carriage has six rollers which are arranged in triplets one behind the other such, that the regions of contact of the individual rollers of each roller triplet with the first guide rod are separated from one another at an angle of approximately 120°.

8. An apparatus according to claim 7, wherein the running carriage has a brake which is preferably in the form of a spring-loaded brake block which is pressed against the front guide rod.

9. An apparatus according to claim 5, wherein the holding device has a stop, an extension or the like which can be coupled to and preferably releasably locked with preferably pneumatic adjusting means for the transverse adjustment of the carrying arm.

10. An apparatus according to claim 1, wherein there are arranged at least at the entrance to the vapour-removal and drying station(s) advancing means which are fixed to that-(those) station(s), for the insertion of the printed circuit boards into the carrying elements.

11. An apparatus according to claim 10, wherein the advancing means are arranged below a plane of transport of the printed circuit boards and comprise a displacing element which can be moved preferably pneumatically in or counter to a direction of transport and acts on a rear transverse edge of the printed circuit board.

12. An apparatus according to claim 1, wherein the transport means for the printed circuit boards comprise in each coating station lateral guide means for the longitudinal edges of the printed circuit boards, which guide means are adjustable automatically with electro-pneumatic adjusting means to the width of the printed circuit board which is to be coated, whereby the printed circuit board is centred in respect of their alignment with the pouring curtain in the coating station, and the adjusting means for the width adjustment of the carrying elements of the vapour-removal and drying station(s) and the adjusting means for the width adjustment of the lateral guide means for the longitudinal edges of the printed circuit board in the particular coating station are coupled to one another.

13. An apparatus according to claims 12, wherein the transport means of all the processing stations of the coating installation comprise carrying elements or guide means for the longitudinal edges of the printed circuit boards, the width of which elements or means being automatically adjustable to the width of the printed circuit boards, and wherein transfer devices are provided at the interfaces between the individual processing stations, which transfer devices are fixed to the preceding or to the following processing station and by means of which the printed circuit boards, after passing through the preceding processing station, are transferred to the following processing station, thereby being supported or guided substantially constantly at their longitudinal edges.

14. An apparatus according to claims 13, which is constructed for coating printed circuit boards on both sides, the printed circuit boards being turned in the preheating station and in the vapour-removal and drying stations.

15. An apparatus according to claim 1, wherein the protective layer is selected from the group consisting of UV-hardenable plastics and lacquer.

16. An apparatus according to claim 1, wherein the two endless circulating roller chains are vertical with respect to the apparatus and wherein each link of the chains is provided with drilled holes for receiving two guide reds of approximately circular cross-section.

* * * * *